US007825547B2

(12) United States Patent
Matsubara et al.

(10) Patent No.: US 7,825,547 B2
(45) Date of Patent: Nov. 2, 2010

(54) ELECTRET DEVICE AND ELECTROSTATIC OPERATING APPARATUS

(75) Inventors: Naoteru Matsubara, Ichinomiya (JP); Yoshiki Murayama, Hirakata (JP); Yoshinori Shishida, Yoro-gun (JP); Hitoshi Hirano, Nishinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 239 days.

(21) Appl. No.: 12/110,013

(22) Filed: Apr. 25, 2008

(65) Prior Publication Data

US 2008/0265686 A1 Oct. 30, 2008

(30) Foreign Application Priority Data

Apr. 27, 2007 (JP) ............................ 2007-118009

(51) Int. Cl.
*G11C 13/02* (2006.01)

(52) U.S. Cl. ..................................................... 307/400

(58) Field of Classification Search .................. 307/400
See application file for complete search history.

(56) References Cited

U.S. PATENT DOCUMENTS 3,812,575 A * 5/1974 Hedman ...................... 29/594
4,513,049 A * 4/1985 Yamasaki et al. ........... 428/194
2007/0230722 A1 * 10/2007 Mori et al. .................. 381/174

FOREIGN PATENT DOCUMENTS

JP 2003-163996 A 6/2003

* cited by examiner

*Primary Examiner*—Robert L. Deberadinis
(74) *Attorney, Agent, or Firm*—Ditthavong, Mori & Steiner, P.C.

(57) ABSTRACT

An electret device includes an electret film capable of storing charges and a protective film formed so as to substantially surround a side end surface of the electret film.

20 Claims, 13 Drawing Sheets

ELECTRET DEVICE AND ELECTROSTATIC OPERATING APPARATUS

CROSS-REFERENCE TO RELATED APPLICATIONS

The priority application number JP2007-118009, Electret Device and Electrostatic Operating Apparatus, Apr. 27, 2007, Yoshiki Murayama, Naoteru Matsubara, Hitoshi Hirano, Yoshinori Shishida, upon which this patent application is based is hereby incorporated by reference.

BACKGROUND OF THE INVENTION

1. Field of the Invention

The present invention relates to an electret device and an electrostatic operating apparatus, and more particularly, it relates to an electret device capable of storing charges and an electrostatic operating apparatus comprising the electret device.

2. Description of the Background Art

An electret silicon condenser microphone (electrostatic operating apparatus) comprising an electret layer (electret device) capable of storing charges is known in general.

The conventional electret silicon condenser microphone comprises a diaphragm electrode formed with an electret layer capable of storing charges and a fixed electrode, and the diaphragm electrode and the fixed electrode relatively move so that electrostatic capacitance between the diaphragm electrode and the fixed electrode are changed, thereby changing a voltage. In the conventional electret silicon condenser microphone, the electret layer is formed on an overall surface of a bottom portion of the diaphragm electrode by application.

SUMMARY OF THE INVENTION

An electret device according to a first aspect of the present invention comprises an electret film capable of storing charges and a protective film formed so as to substantially surround a side end surface of the electret film.

An electrostatic operating apparatus according to a second aspect of the present invention comprises a fixed electrode, a movable electrode capable of moving with respect to the fixed electrode, provided so as to be opposed to the fixed electrode at a prescribed distance and an electret device including an electret film capable of storing charges, formed on an upper surface of either the fixed electrode or the movable electrode and a protective film formed so as to substantially surround the side end surface of the electret film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of an electret device 100 according to a first embodiment of the present invention will be now described with reference to FIGS. 1 and 2.

Figure 1:
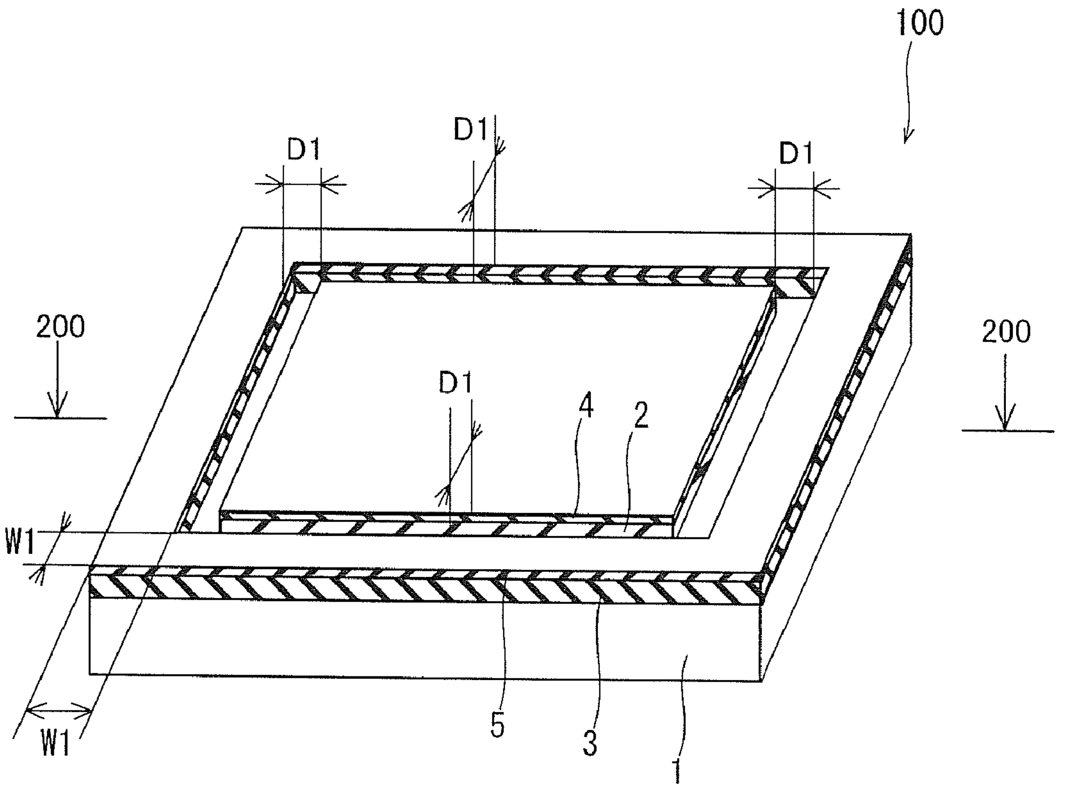
FIG. 1 is a perspective view of an electret device according to a first embodiment of the present invention.
Figure 2:
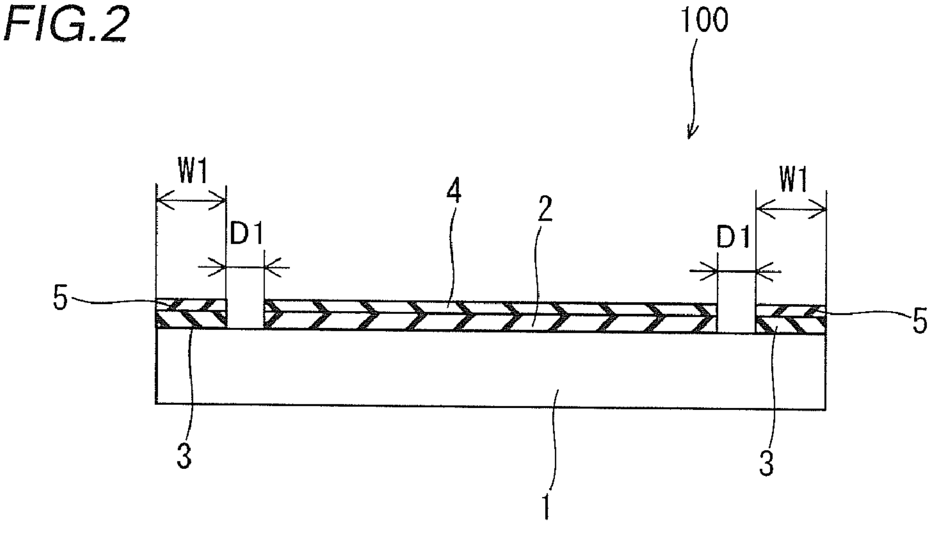
FIG. 2 is a sectional view taken along the line 200-200 in FIG. 1.

In the electret device 100 according to the first embodiment, an electret film 2 injected with charges, made of $SiO_2$ having a thickness of about 0.1 μm to about 100 μm is formed on an upper surface of a substrate 1 having a thickness of about 300 μm to about 1000 μm, as shown in FIGS. 1 and 2. According to the first embodiment, a protective film 3 made of $SiO_2$ having a width of about 0.1 mm to about 5 mm and a thickness of about 0.1 μm to about 100 μm is so formed as to surround side end surfaces of the electret film 2 at an interval D1 of about 0.1 mm to about 5 mm. According to the first embodiment, the thickness of the protective film 3 is substantially equal to that of the electret film 2. According to the first embodiment, the protective film 3 and the electret film 2 are formed from the same layer. According to the first embodiment, charges having the same polarity as the electret film 2 are injected into the protective film 3, and the protective film 3 has a function of inhibiting charges stored in the electret film 2 from flowing out. MSQ films 4 and 5 for inhibiting the charges, made of MSQ (methyl silses quioxane) having thicknesses of about 0.3 μm are formed on upper surfaces of the electret film 2 and the protective film 3 respectively. The MSQ films 4 and 5 are each an example of the "third charge outflow inhibition film" in the present invention.

The effects of the protective film 3 according to the first embodiment of the present invention will be described with reference to FIGS. 3 to 6.

Figure 3:
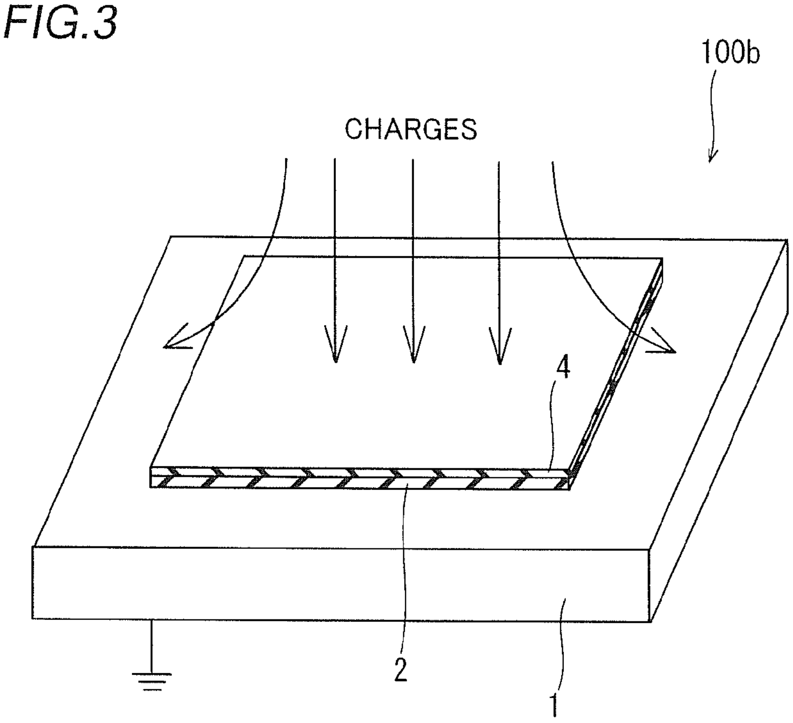
FIG. 3 is a diagram showing a state of injecting charges in a case where no charge outflow inhibition film is formed around an electret film.

As shown in FIG. 3, in a case of an electret device 100*b* formed with no protective film 3 (see FIG. 1) around the electret film 2, charges to be injected are deviated on ends of the electret film 2 outside the electret film 2 by repulsion due to charges previously injected into the electret film 2. Thus, charges are difficult to be injected.

Figure 4:
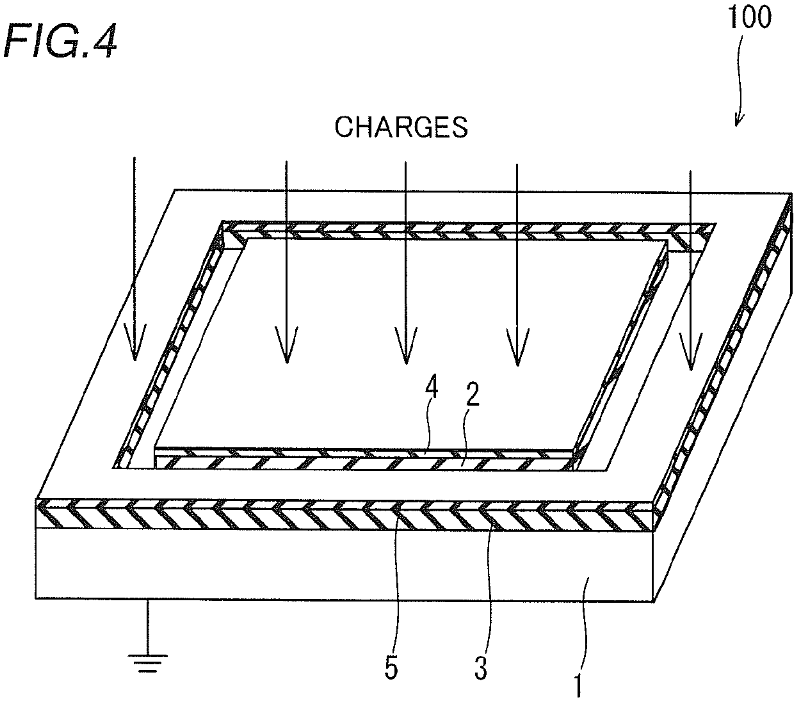
FIG. 4 is a diagram showing a state of injecting charges in a case where a charge outflow inhibition film is formed around the electret film.

In a case where the protective film 3 is formed around the electret film 2 as shown in FIG. 4, on the other hand, repulsion due to the charges previously injected into the protective film 3 inhibits the charges to be injected into the electret film 2 from being deviated outside the electret film 2. Thus, charges are easily to be injected.

Figure 5:
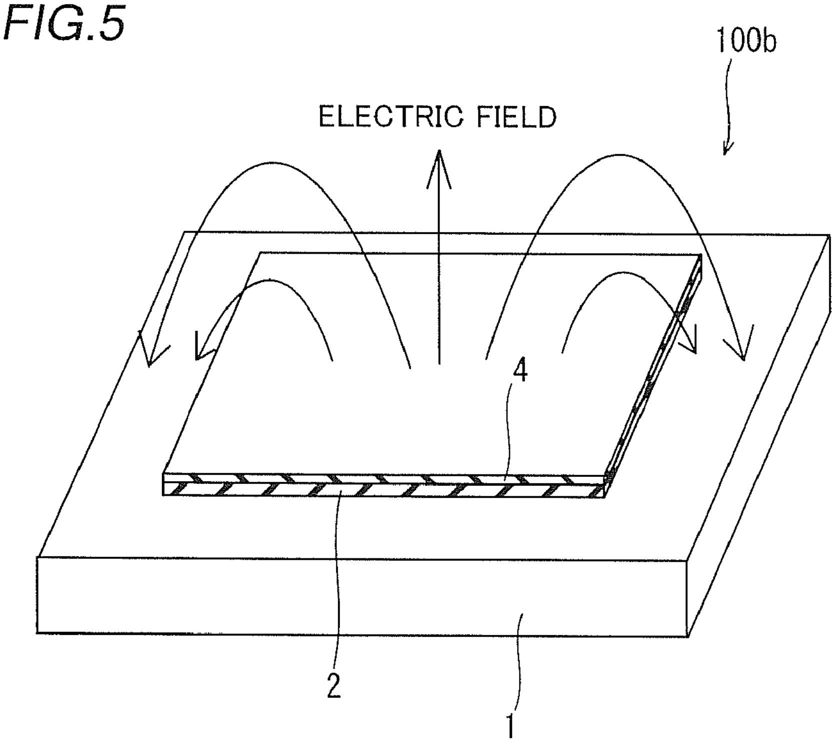
FIG. 5 is a diagram showing the direction of an electric field after injecting the charges in a case where no charge outflow inhibition film is formed around the electret film.

As shown in FIG. 5, in a case where no protective film 3 (see FIG. 1) is formed around the electret film 2, electric field due to the charges injected into the electret film 2 is generated in the vicinity of the center of the electret film 2 along the normal direction of the electret film 2. At a position deviated from the vicinity of the center of the electret film 2, on the other hand, the electric field bends toward the substrate. Thus, the intensity of the electric field is reduced.

Figure 6:
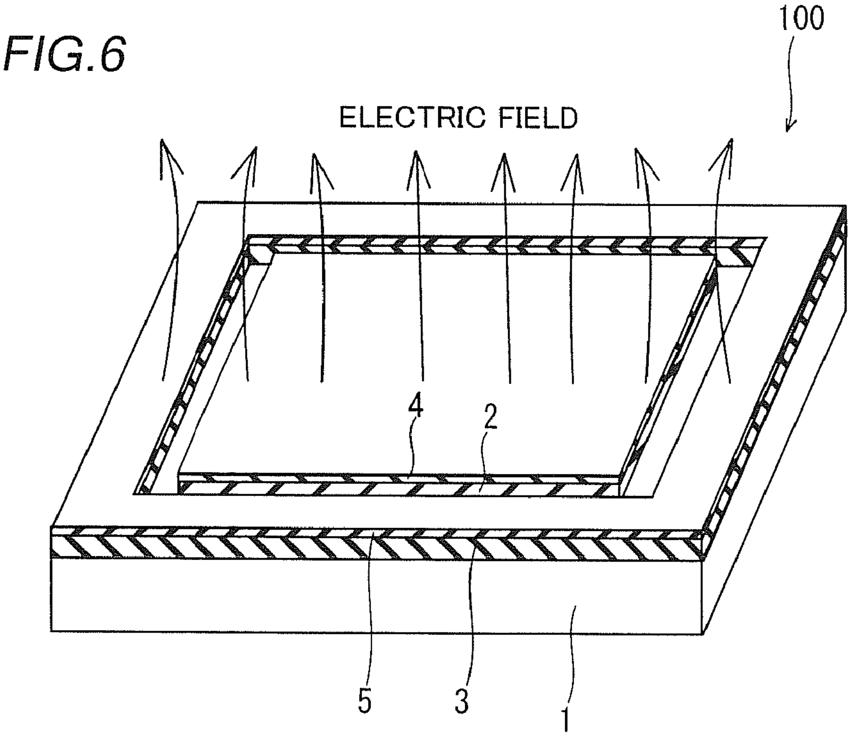
FIG. 6 is a diagram showing the direction of an electric field after injecting the charges in a case where the charge outflow inhibition film is formed around the electret film.

In the case where the protective film 3 is formed around the electret film 2, on the other hand, the electric field due to the charges injected into the electret film 2 are generated along the normal direction of the electret film 2 by the electric field due to the charges stored in the protective film 3, as shown in FIG. 6.

The effects of the protective film 3 according to the first embodiment of the present invention will be described with reference to FIGS. 7 to 9.

Figure 7:
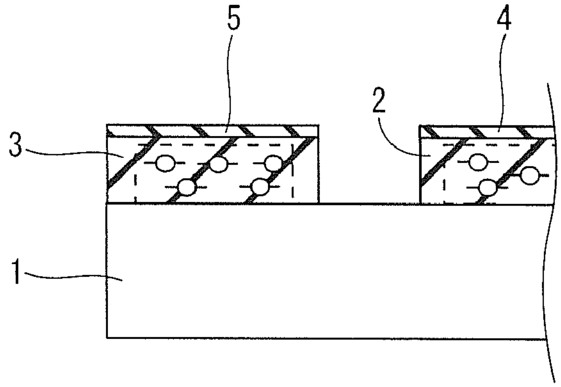
FIGS. 7 to 9 are diagrams for illustrating a state where charges flow out from the electret film.

As shown in FIG. 7, the electret film 2 and the protective film 3 are in states where charges are injected thereinto. White circles in FIG. 7 denote charges stored in the electret film 2 and the protective film 3.

Figure 8:
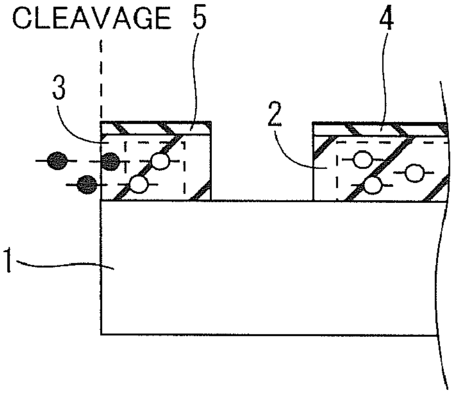

When the protective film 3 is cut by cleavage as shown in FIG. 8, dielectric breakdown occurs on the side end surfaces of the protective film 3, whereby the stored charges flow out. In other words, leak paths of the charges are formed on the side end surfaces of the protective film 3. Black circles in FIG. 8 denote charges flowing out from the protective film 3.

Figure 9:
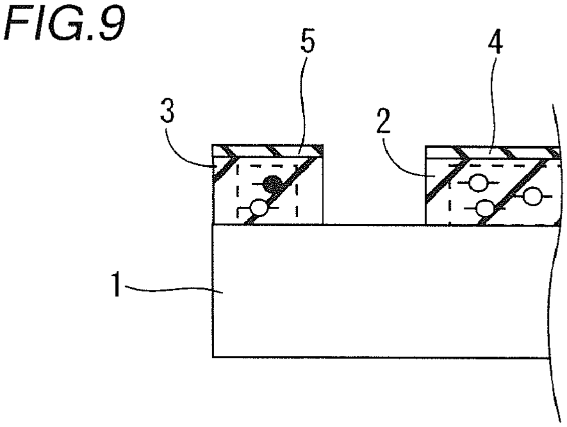

As shown in FIG. 9, charges continuously flow out from the side end surfaces of the protective film 3 as time advances, whereby the quantity of the charges stored in the protective film 3 are reduced. In the electret film 2, on the other hand, repulsion due to the charges stored in the protective film 3 inhibits charges from flowing out from the side end surfaces of the electret film 2.

An experiment in which charges flowing out from side end surfaces of an electret film 12 are measured will be described with reference to FIGS. 10 to 14.

Figure 10:
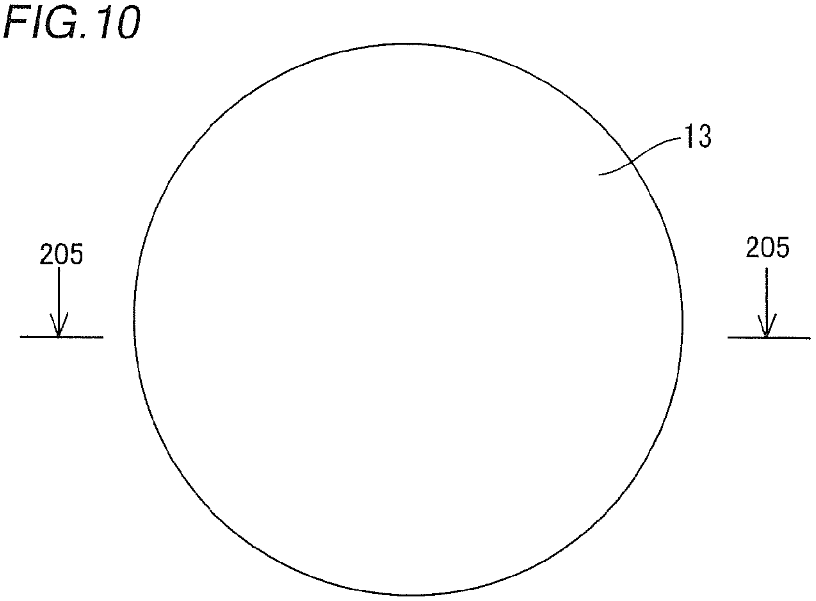
FIG. 10 is a plan view of a sample of an experiment in which charges flowing out from side end surfaces of the electret film are measured.
Figure 11:
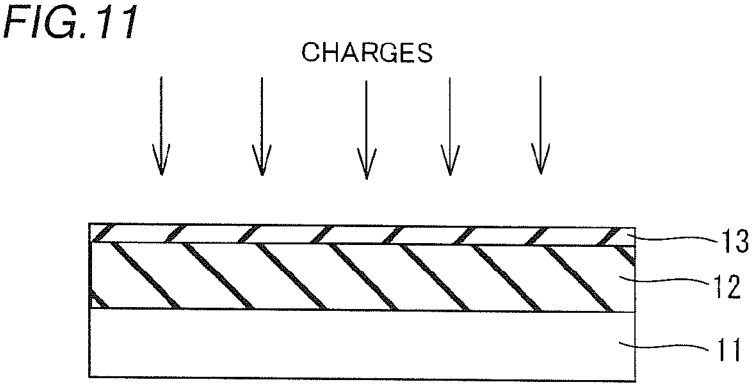
FIG. 11 is a sectional view taken along the line 205-205 in FIG. 10.

As shown in FIGS. 10 and 11, the electret film 12 made of $SiO_2$ having a thickness of about 1 μm is formed on an upper surface of a circular substrate 11. A MSQ film 13 made of MSQ having a thickness of about 0.3 μm is formed on an upper surface of the electret film 12.

Figure 12:
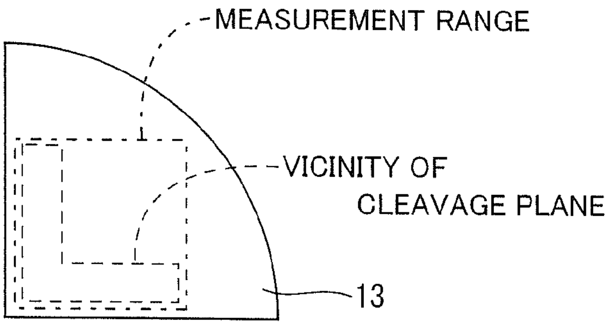
FIG. 12 is a plan view of ¼ of a sample in FIG. 10 cleaved.

As shown in FIG. 11, charges are injected from an upper surface of the MSQ film 13 by corona discharge. Thereafter a sample obtained by cleaving the substrate 11, the electret film 12 and the MSQ film 13 into a quarter, is formed as shown in FIG. 12.

An acceleration test as to humidity was carried out under a condition of a temperature of 65° C. and a humidity of 75% for one hour. Thereafter the surface potential of the electret film 12 was measured at intervals of about 15 mm. The range of the measurement is the range surrounded by an alternate long and short dash line shown in FIG. 12. The range surrounded by a dotted line shown in FIG. 12 shows the vicinity of a cleavage plane.

Figure 13:
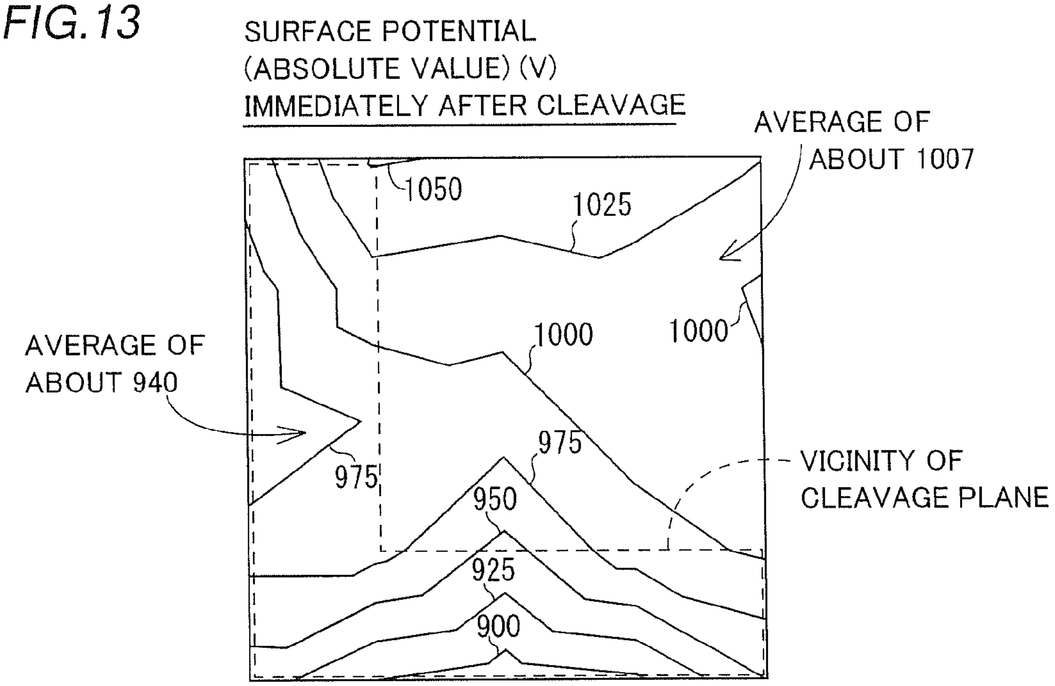
FIG. 13 is a diagram showing a surface potential of the electret film immediately after cleavage.

As shown in FIG. 13, it has been proved that a potential in the vicinity of the cleavage plane shown by the dotted line is gradually reduced in a cleavage plane immediately after the cleavage. It has been proved that the average amount of the potential in the vicinity of the cleavage plane (about −940 V) is smaller than the average amount of the potential on a portion other than the vicinity of the cleavage plane (about −1007 V).

Figure 14:
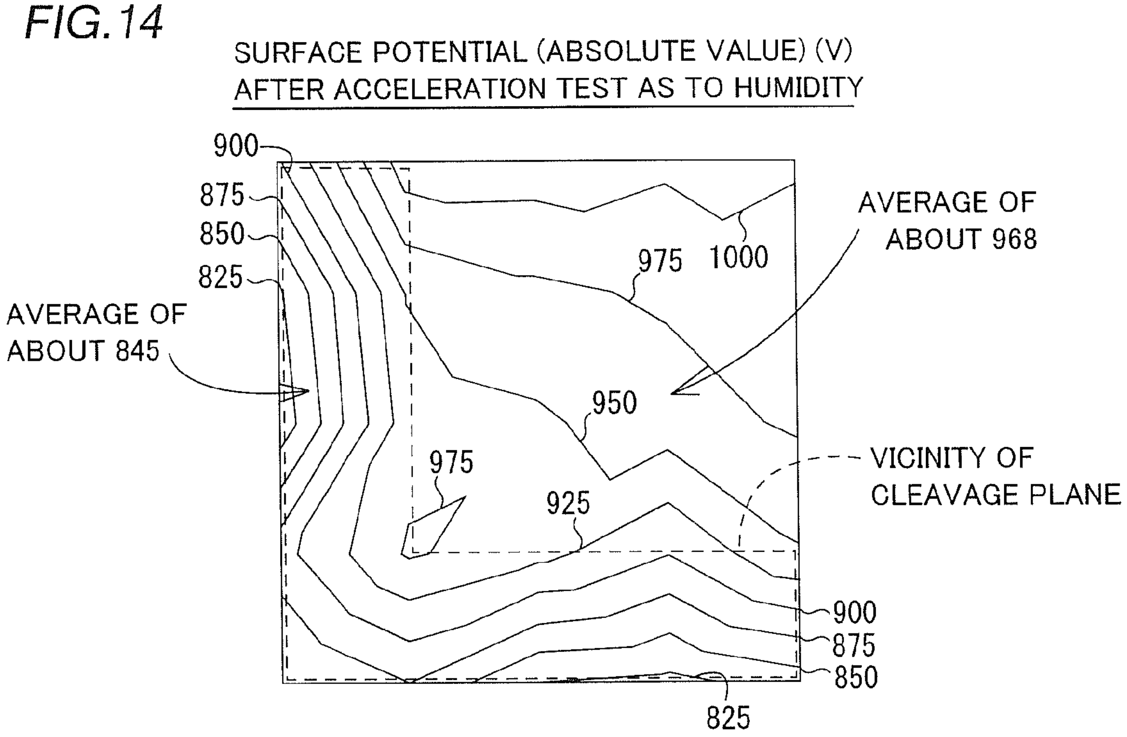
FIG. 14 is a diagram showing a surface potential of the electret film after an acceleration test as to humidity.

As shown in FIG. 14, it has been proved that a potential in the vicinity of the cleavage plane is gradually reduced in the cleavage plane after the acceleration test as to humidity similarly to FIG. 13. It has been proved that the average amount of the potential in the vicinity of the cleavage plane (about −845 V) is smaller than the average amount of the potential on the portion other than the vicinity of the cleavage plane (about −968 V). When comparing the rates of change in the surface potentials immediately after the cleavage and after the acceleration test in the vicinity of the cleavage plane and on the portion other than the vicinity of the cleavage plane, the surface potential in the vicinity of the cleavage plane was reduced by about 10.1% while the surface potential on the portion other than the vicinity of the cleavage plane was reduced by about 3.8%. Thus, it has been confirmed that outflow of the charges in the vicinity of the cleavage plane is larger than that on the portion other than the vicinity of the cleavage plane.

According to the first embodiment, as hereinabove described, the protective film 3 is so formed as to surround the side end surfaces of the electret film 2, whereby the side end surfaces of the electret film 2 is not exposed to the side end surfaces of the electret device 100, and hence the side end surfaces of the electret film 2 can be inhibited from damage when the electret device 100 is cut into chips by dicing or cleavage. Thus, the charges can be inhibited from flowing out from the side end surfaces of the electret film 2 and hence the charges stored in the electret film 2 can be inhibited from reduction. The side end surfaces of the electret film 2 are patterned by etching, for example. The damage to the side end surfaces by cleavage is smaller than the damage by etching, and hence the charges can be inhibited from flowing out from the side end surfaces of the electret film 2 as compared with a case of cleaving the electret film 2.

According to the first embodiment, as hereinabove described, the protective film 3 is so formed as to surround the side end surfaces of the electret film 2 at the interval D1 and is made of $SiO_2$ stored with charges, whereby the protective film 3 is so formed as to surround the side end surfaces of the electret film 2 at the prescribed interval and hence the electric field due to the charges stored in the protective film 3 can inhibit the charges to be injected when injecting the charges from being deviated outside the electret film 2. The protective film 3 is formed by $SiO_2$ stored with charges, whereby the repulsion due to the charges stored in the protective film 3 can inhibit the charges stored in the electret film 2 from flowing out from the side end surfaces of the electret film 2. Thus, the charges stored in the electret film 2 can be inhibited from reduction. The electric field due to the charges stored in the protective film 3 can inhibit the direction of the electric field due to the charges stored in the electret film 2 from being deviated from the normal direction of the electret film 2, and hence the density of the electric field due to the charges stored in the electret film 2 can be inhibited from reduction.

According to the first embodiment, as hereinabove described, the thickness of the protective film 3 is substantially equal to that of the electret film 2, whereby the protective film 3 can reliably inhibit the charges from flowing out from the electret film 2 dissimilarly to a case where the thickness of the protective film 3 is smaller than that of the electret film 2.

According to the first embodiment, as hereinabove described, the electret film 2 and the protective film 3 store the charges having the same polarity, whereby the charges stored in the protective film 3 and the charges stored in the electret film 2 are repulsive and hence the charges stored in the electret film 2 can be inhibited from flowing out.

According to the first embodiment, as hereinabove described, the electret film 2 and the protective film 3 are formed from the same layer, whereby the electret film 2 and the protective film 3 can be formed by etching in the same step.

According to the first embodiment, as hereinabove described, the MSQ films 4 and 5 are formed on the surfaces of the electret film 2 and the protective film 3 respectively, whereby the charges can be inhibited from flowing out from the surfaces of the electret film 2 and the protective film 3.

Second Embodiment

Figure 15:
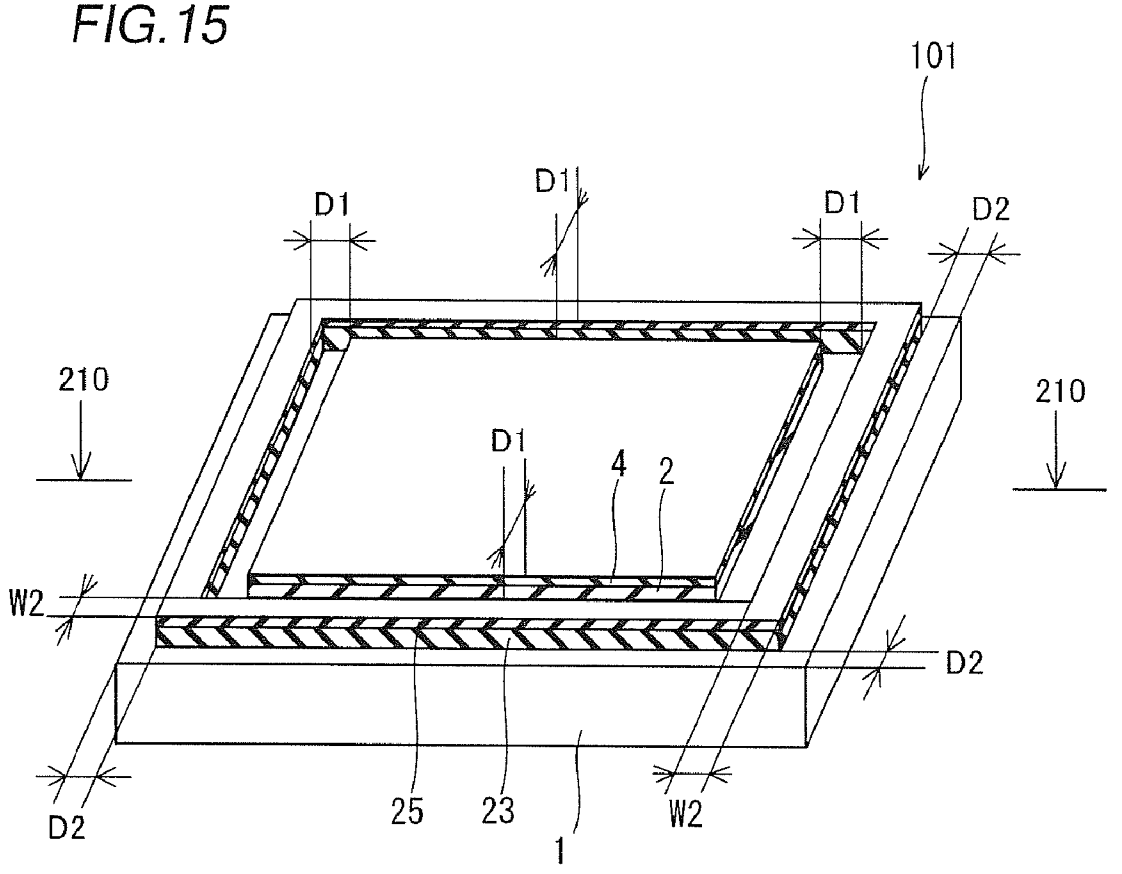
FIG. 15 is a perspective view of an electret device according to a second embodiment of the present invention.
Figure 16:
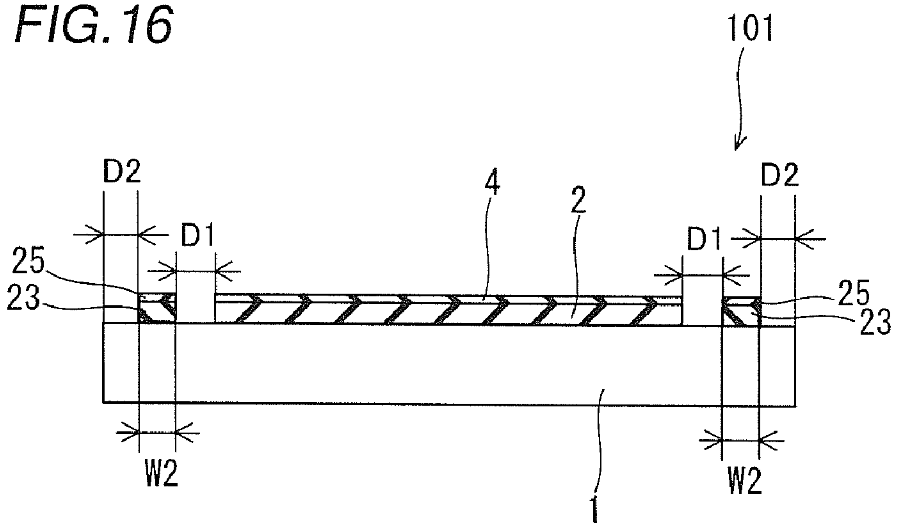
FIG. 16 is a sectional view taken along the line 210-210 in FIG. 15.

Referring to FIGS. 15 and 16, an electret device 101 according to a second embodiment has a structure in which a protective film 23 is formed at an interval D2 from ends of the substrate 1 dissimilarly to the aforementioned first embodiment.

In the electret device 101 according to the second embodiment, the protective film 23 is formed at the prescribed interval D2 from the ends of the substrate 1 and at an interval D1 of about 0.1 mm to about 5 mm from side end surfaces of an electret film 2 so as to surround the side end surfaces of the electret film 2, as shown in FIGS. 15 and 16. A MSQ film 25 for inhibiting charges from flowing out, having a thickness of about 0.3 μm is formed on an upper surface of the protective film 23. The MSQ film 25 is an example of the "third charge outflow inhibition film" in the present invention. The remaining structure of the electret device according to the second embodiment is similar to that of the electret device according to the aforementioned first embodiment.

According to the second embodiment, as hereinabove described, the protective film 23 is formed on the substrate 1 at the interval D2 from the ends of the substrate 1, whereby the interval D2 exists between the protective film 23 and the ends of the substrate 1 and hence the protective film 23 can be inhibited from damage by cleavage when the electret device 101 is cut into chips by dicing or cleavage. The side end surfaces of the protective film 23 are patterned by etching, for example. The damage to the side end surfaces by cleavage is smaller than the damage by etching, and hence the charges can be inhibited from flowing out from the side end surfaces of the protective film 23 as compared with a case of cleaving the protective film 23.

The remaining effects of the second embodiment are similar to those of the aforementioned first embodiment.

Third Embodiment

Figure 17:
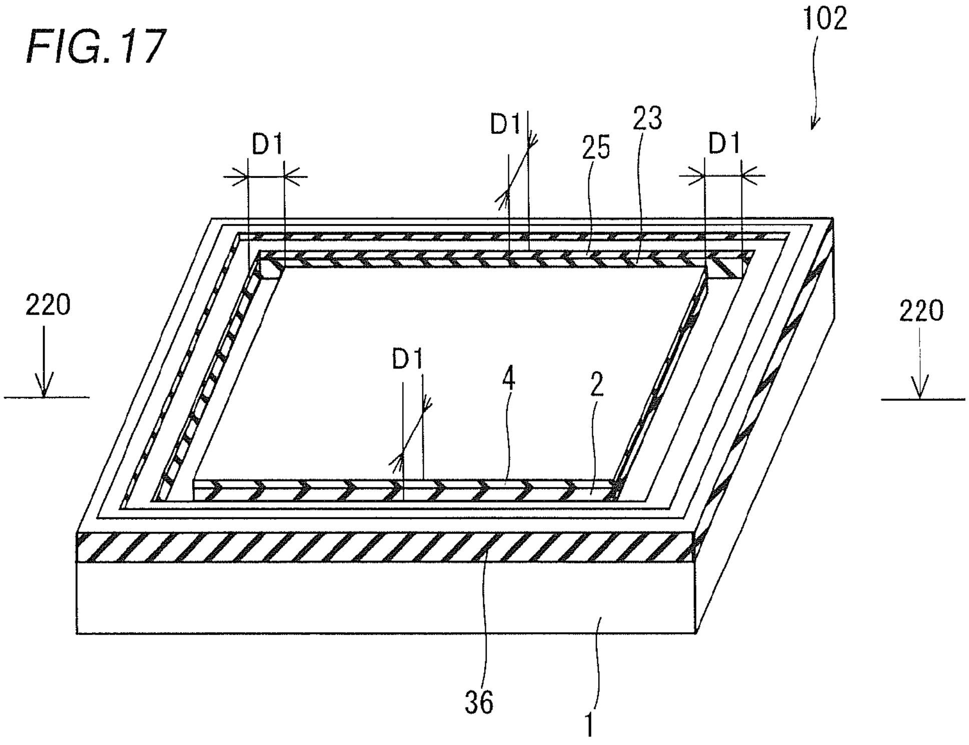
FIG. 17 is a perspective view of an electret device according to a third embodiment of the present invention.
Figure 18:
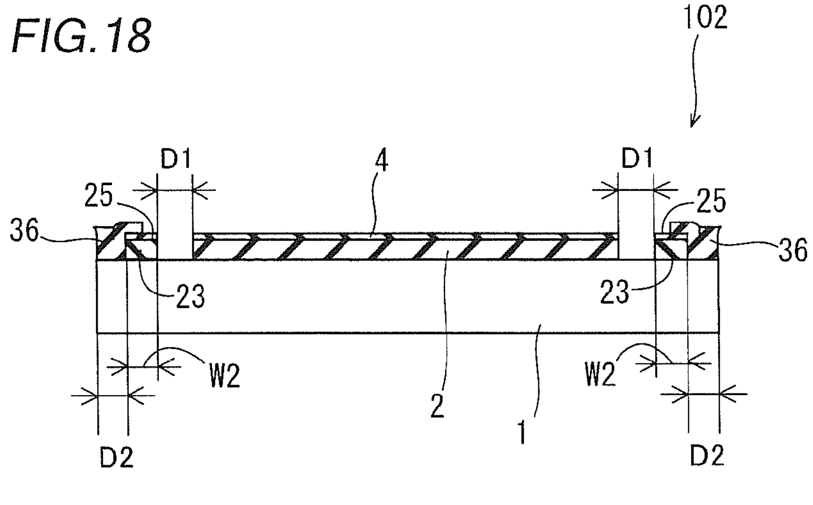
FIG. 18 is a sectional view taken along the line 220-220 in FIG. 17.

Referring to FIGS. 17 and 18, an electret device 102 according to a third embodiment has a structure in which a charge outflow inhibition film 36 is formed between a protective film 23 and ends of a substrate 1 dissimilarly to the aforementioned second embodiment.

In the electret device 102 according to the third embodiment, the charge outflow inhibition film 36 made of MSQ, capable of inhibiting charges stored in the protective film 23 from flowing out is formed between the protective film 23 and the ends of the substrate 1, as shown in FIGS. 17 and 18. The charge outflow inhibition film 36 is an example of the "first charge outflow inhibition film" in the present invention. The MSQ is an example of the "organic material capable of inhibiting charges from flowing out" in the present invention. According to the third embodiment, the charge outflow inhibition film 36 is so formed as to cover the side end surfaces of the protective film 23. According to the third embodiment, the thickness of the charge outflow inhibition film 36 is not less than that of the protective film 23. The remaining structure of the electret device according to the third embodiment is similar to that of the electret device according to the aforementioned second embodiment.

According to the third embodiment, as hereinabove described, the charge outflow inhibition film 36 made of MSQ, capable of inhibiting the charges stored in the protective film 23 from flowing out is formed between the protective film 23 and the ends of the substrate 1, whereby the charge outflow inhibition film 36 is formed on the side end surfaces of the protective film 23 and hence charges can be inhibited from flowing out from the side end surfaces of the protective film 23. Thus, the charges stored in the protective film 23 can be inhibited from reduction and hence repulsion against the charges stored in the electret film 2 can be increased. Consequently, the charges stored in the electret film 2 can be inhibited from reduction.

According to the third embodiment, as hereinabove described, the charge outflow inhibition film 36 is so formed as to cover the side end surfaces of the protective film 23, whereby the charges can be reliably inhibited from flowing out from the protective film 23.

According to the third embodiment, as hereinabove described, the thickness of the charge outflow inhibition film 36 is not less than that of the protective film 23, whereby the charges can be reliably inhibited from flowing out from the protective film 23 dissimilarly to a case where the thickness of the charge outflow inhibition film 36 is smaller than that of the protective film 23.

The remaining effects of the third embodiment are similar to those of the aforementioned first embodiment.

Fourth Embodiment

Figure 19:
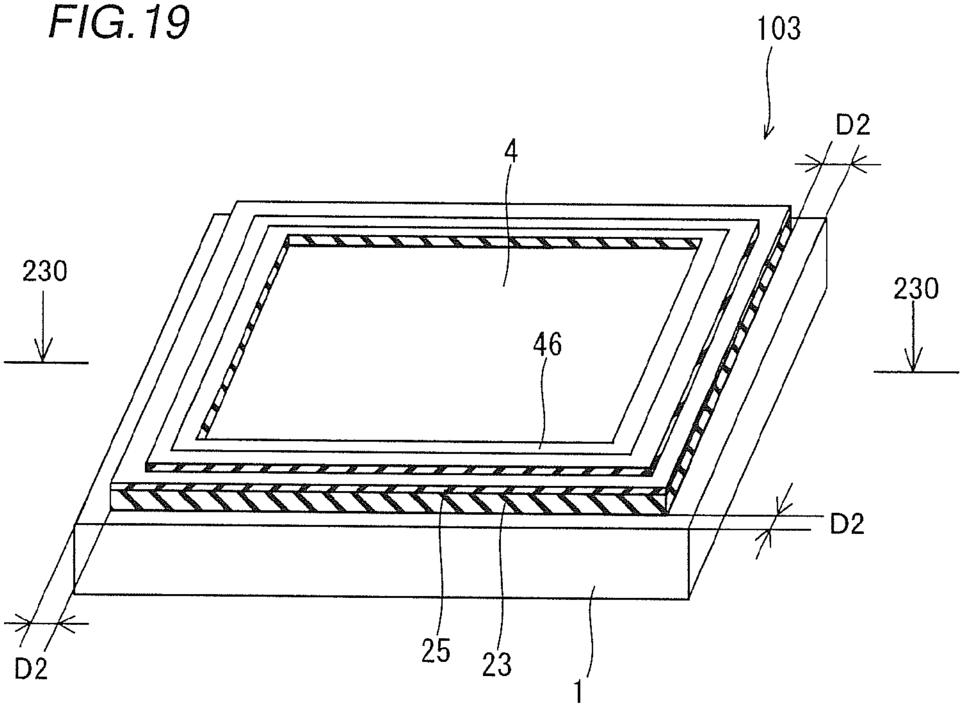
FIG. 19 is a perspective view of an electret device according to a fourth embodiment of the present invention.
Figure 20:
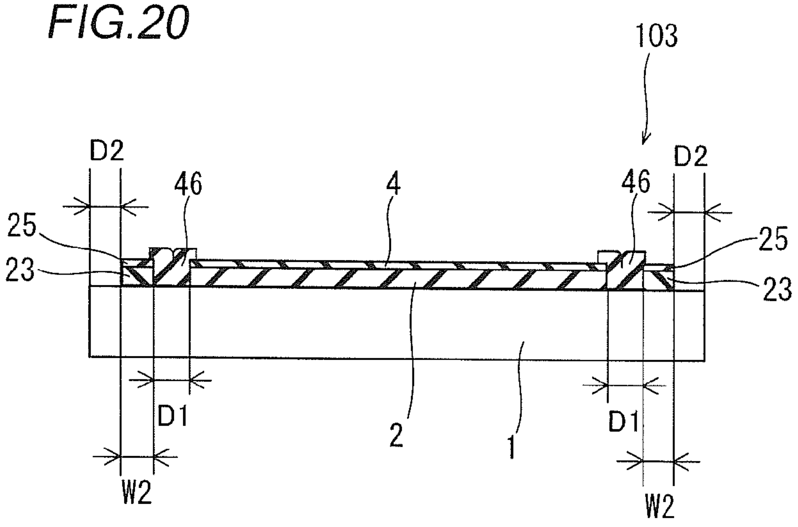
FIG. 20 is a sectional view taken along the line 230-230 in FIG. 19.

Referring to FIGS. 19 and 20, an electret device 103 according to a fourth embodiment has a structure in which a charge outflow inhibition film 46 is formed between an electret film 2 and a protective film 23 dissimilarly to the aforementioned second embodiment.

In the electret device 103 according to the fourth embodiment, the charge outflow inhibition film 46 made of MSQ, capable of inhibiting charges stored in the electret film 2 from flowing out is formed between the electret film 2 and the protective film 23, as shown in FIGS. 19 and 20. The charge outflow inhibition film 46 is an example of the "second charge outflow inhibition film" in the present invention. The MSQ is an example of the "organic material capable of inhibiting charges from flowing out" in the present invention. According to the fourth embodiment, the charge outflow inhibition film 46 is so formed as to cover side end surfaces of the electret film 2 and side end surfaces of the protective film 23. According to the fourth embodiment, the thickness of the charge outflow inhibition film 46 is not less than the thickness of the electret film 2 and the thickness of the protective film 23. The remaining structure of the electret device according to the fourth embodiment is similar to that of the electret device according to the aforementioned second embodiment.

According to the fourth embodiment, as hereinabove described, the charge outflow inhibition film 46 made of MSQ, capable of inhibiting the charges stored in the electret film 2 from flowing out is formed between the electret film 2 and the protective film 23, whereby the charge outflow inhibition film 46 is formed on the side end surfaces of the electret film 2 and hence charges can be inhibited from flowing out from the side end surfaces of the electret film 2. Thus, the charges stored in the electret film 2 can be inhibited from reduction According to the fourth embodiment, as hereinabove described, the charge outflow inhibition film 46 is so formed as to cover the side end surfaces of the electret film 2 and the side end surfaces of the protective film 23, whereby the charges can be reliably inhibited from flowing out from the electret film 2 and the protective film 23.

According to the fourth embodiment, as hereinabove described, the thickness of the charge outflow inhibition film 46 is not less than the thickness of the electret film 2 and the thickness of the protective film 23, whereby the charges can be reliably inhibited from flowing out from the electret film 2 and the protective film 23 dissimilarly to a case where the thickness of the charge outflow inhibition film 46 is smaller than the thickness of the electret film and the thickness of the protective film 23.

The remaining effects of the fourth embodiment are similar to those of the aforementioned first embodiment.

Fifth Embodiment

Figure 21:
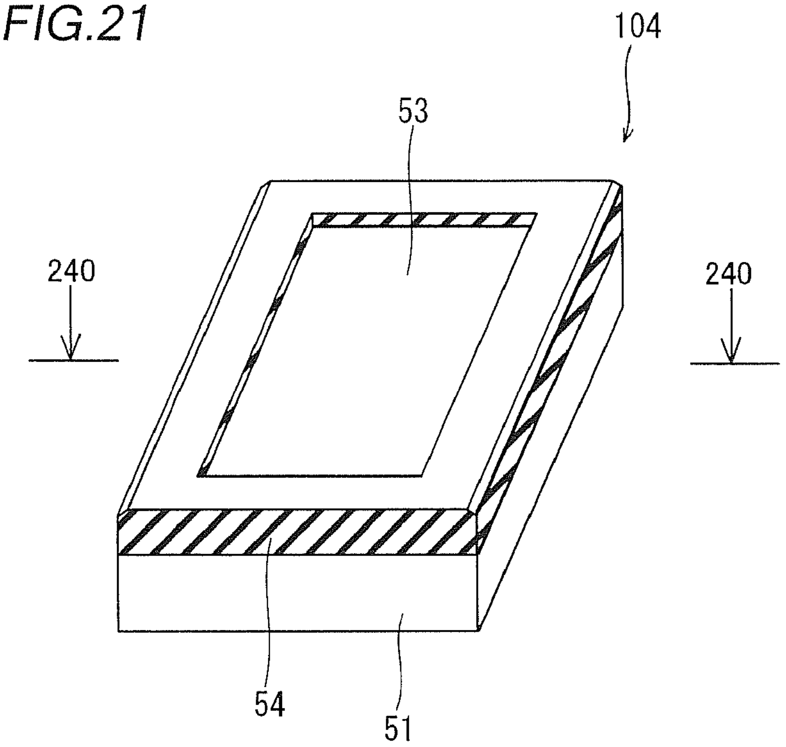
FIG. 21 is a perspective view of an electret device according to a fifth embodiment of the present invention.
Figure 22:
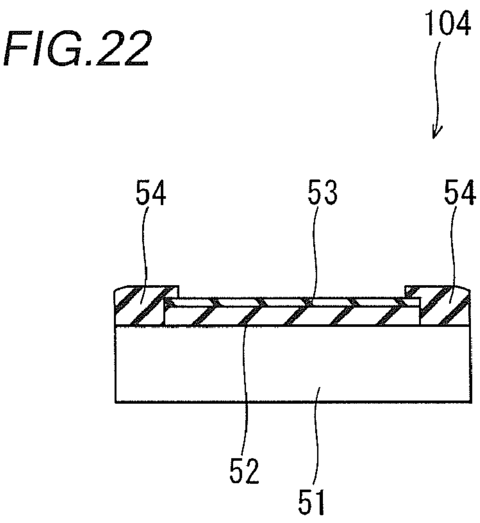
FIG. 22 is a sectional view taken along the line 240-240 in FIG. 21.

Referring to FIGS. 21 and 22, an electret device 104 according to a fifth embodiment has a structure in which a charge outflow inhibition film 54 is so formed as to surround side end surfaces of an electret film 52 dissimilarly to the aforementioned first embodiment.

In the electret device 104 according to the fifth embodiment, an electret film 52 injected with charges, made of $SiO_2$ having a thickness of about 0.1 μm to about 100 μm is formed on an upper surface of a substrate 51 having a thickness of about 300 μm to about 1000 μm, as shown in FIGS. 21 and 22. A MSQ film 53 for inhibiting charges from flowing out, having a thickness of about 0.3 μm is formed on an upper surface of the electret film 52. The MSQ film 53 is an example of the "third charge outflow inhibition film" in the present invention. The charge outflow inhibition film 54 made of MSQ is so formed as to surround the side end surfaces of the electret film 52 and the MSQ film 53.

According to a fifth embodiment, as hereinabove described, the charge outflow inhibition film 54 is so formed as to surround the side end surfaces of the electret film 52, whereby the side end surfaces of the electret film 52 can be inhibited from damage when the electret device 104 is cut into chips by cleavage and hence the charges can be inhibited from flowing out from the side end surfaces of the electret film 52. Thus, the charges stored in the electret film 52 can be inhibited from reduction. Additionally, the charge outflow inhibition film 54 inhibiting the charges stored in the electret film 52 from flowing out is formed around the electret film 52, and hence the charges can be inhibited from flowing out from the side end surfaces of the electret film 52.

Sixth Embodiment

Figure 23:
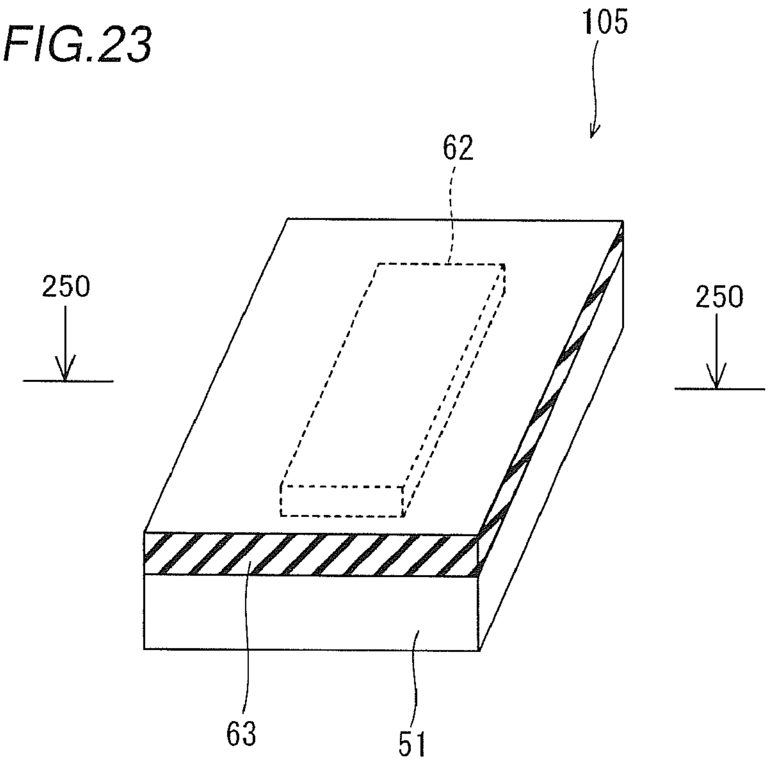
FIG. 23 is a perspective view of an electret device according to a sixth embodiment of the present invention.
Figure 24:
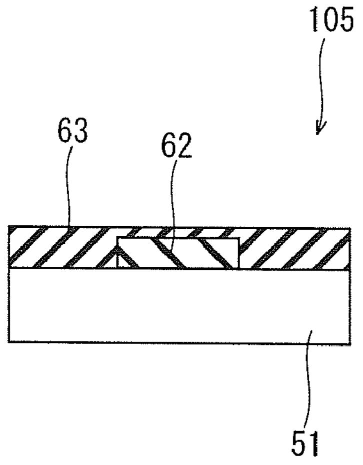
FIG. 24 is a sectional view taken along the line 250-250 in FIG. 23.

Referring to FIGS. 23 and 24, an electret device 105 according to a sixth embodiment has a structure in which a charge outflow inhibition film 63 is so formed as to surround a surface of an electret film 62 dissimilarly to the aforementioned fifth embodiment.

In the electret device 105 according to the sixth embodiment, the charge outflow inhibition film 63 made of MSQ is so formed as to cover the surface of the electret film 62, as shown in FIGS. 23 and 24. The remaining structure of the electret device according to the sixth embodiment is similar to that of the electret device according to the aforementioned fifth embodiment.

According to the sixth embodiment, as hereinabove described, the charge outflow inhibition film 63 is formed on the surface of the electret film 62, whereby the side end surfaces of the electret film 62 can be inhibited from damage when the electret device 105 is cut into chips by dicing or cleavage and hence the charges can be inhibited from flowing out from the side end surfaces of the electret film 62. Thus, the charges stored in the electret film 62 can be inhibited from reduction. Additionally, the charge outflow inhibition film 63 inhibiting the charges stored in the electret film 62 from flowing out is formed around the electret film 62, and hence the charges can be inhibited from flowing out from the side end surfaces of the electret film 62.

Seventh Embodiment

A structure of an electrostatic induction generator 110 according to a seventh embodiment will be described with reference to FIGS. 25 and 26. The seventh embodiment of the present invention is applied to the electrostatic induction generator 110 which is an exemplary electrostatic operating apparatus.

Figure 25:
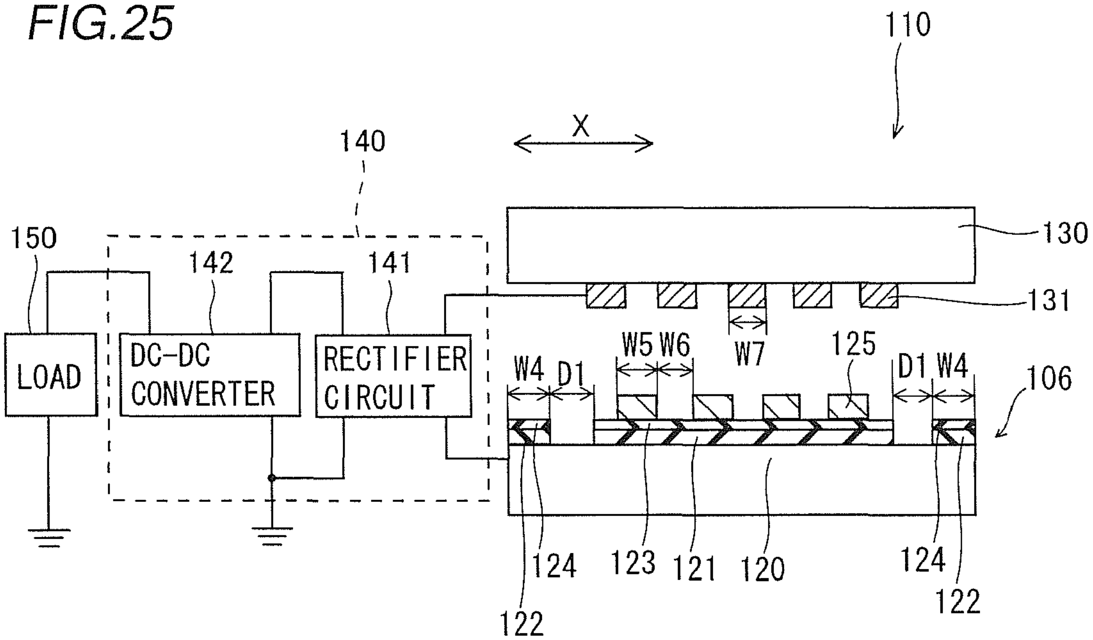
FIG. 25 is a schematic diagram of an electrostatic induction generator according to a seventh embodiment of the present invention.

The electrostatic induction generator 110 according to the seventh embodiment comprises a fixed substrate 120, a movable substrate 130 capable of moving with respect to the fixed substrate 120 and a circuit portion 140 shown in FIG. 25. A load 150 driven with the electrostatic induction generator 110 is connected to the electrostatic induction generator 110. This load 150 is grounded.

Figure 26:
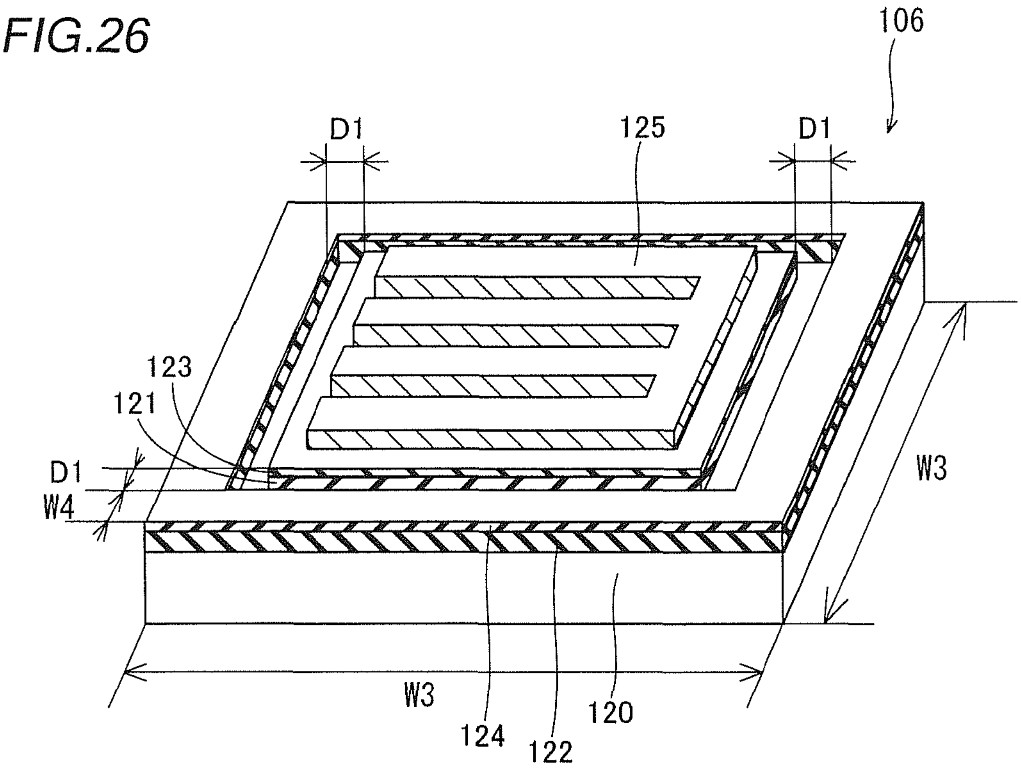
FIG. 26 is a perspective view of an electret device according to the seventh embodiment of the present invention.

As shown in FIG. 26, the fixed substrate 120 of an electret device 106 is made of a conductive material having a width W3 of about 10 mm to about 50 mm and a thickness of about 300 μm to about 1000 μm. The fixed substrate 120 is an example of the "fixed electrode" in the present invention. The circuit portion 140 is connected to the fixed substrate 120.

An electret film 121 injected with charges, made of $SiO_2$ having a thickness of about 0.1 μm to about 100 μm is formed on an upper surface of the fixed substrate 120. According to the seventh embodiment, a protective film 122 made of $SiO_2$ having a width W4 of about 0.1 mm to about 5 mm and a thickness of about 0.1 μm to about 100 μm is so formed as to surround side end surfaces of the electret film 121 at an interval D1 of about 0.1 mm to about 5 mm. Charges are injected into the protective film 122 similarly to the electret film 121 and the protective film 122 has a function of inhibiting charges stored in the electret film 121 from flowing out. MSQ films 123 and 124 for inhibiting the charges from flowing out, having thicknesses of about 0.3 μm are formed on upper surfaces of the electret film 121 and the protective film 122 respectively. The MSQ films 123 and 124 are each an example of the "fourth charge outflow inhibition film" in the present invention. A comb-like metal film 125 made of Al or Ti having a thickness of about 0.1 μm to about 10 μm is formed on an upper surface of the MSQ film 123. Each width W5 of teeth of the comb-like metal film 125 and each interval W6 between the teeth are about 0.01 mm to about 1 mm.

The movable substrate 130 of the electrostatic induction generator 110 is made of glass having a thickness of about 300 μm to about 1000 μm. Movable electrodes 131 are formed on an upper surface closer to the fixed substrate 120 of the movable substrate 130 at prescribed intervals. Each movable electrode 131 is made of Al having a thickness of about 0.05 mm to about 1 mm and has a width W7. The circuit portion 140 is connected to the movable electrodes 131.

The circuit portion 140 includes a rectifier circuit 141 for rectifying power generated, a DC-DC converter 142 for converting a voltage level of a direct current rectified with the rectifier circuit 141. The rectifier circuit 141 is connected to the fixed substrate 120 and the movable electrodes 131, and also connected to the DC-DC converter 142. The load 50 driven through power generated with the electrostatic induction generator 110 is connected to the DC-DC converter 142. The DC-DC converter 142 is grounded.

A power generating operation of the electrostatic induction generator 110 according to the seventh embodiment of the present invention will be now described with reference to FIG. 25.

As shown in FIG. 25, when vibration is not applied to the electrostatic induction generator 110, the surface of the electret film 121 and the movable electrodes 131 are so arranged as to be opposed to each other at a prescribed interval and hence charges opposite to the charges stored in the electret film 121 are stored in the movable electrodes 131 by electrostatic induction.

The movable electrodes 131 moves in a direction X resulting from vibration applied to the electrostatic induction generator 110 in a horizontal direction (direction X), whereby the movable electrodes 131 move to positions opposed to the teeth of the comb-like metal film 125. Thus, the potential of a region opposed to each movable electrode 131 is changed, and hence the quantity of the charges stored in the movable electrodes 131 by electrostatic induction is changed. This changed charges become a current, which is outputted to the load 150 through the rectifier circuit 141 and the DC-DC converter 142. The movable electrodes 131 repeat the aforementioned operation by vibration in the direction X, whereby power is continuously generated.

According to the seventh embodiment, as hereinabove described, the electrostatic induction generator comprises the electret device 106 including the protective film 122 formed so as to surround the side end surfaces of the electret film 121 and inhibiting the charges stored in the electret film 121 from flowing out, whereby the electret device 106 in which the protective film 122 inhibits the charges stored in the electret film 121 from reduction can be employed and hence power generation efficiency of the electrostatic induction generator 110 can be improved.

Eighth Embodiment

Figure 27:
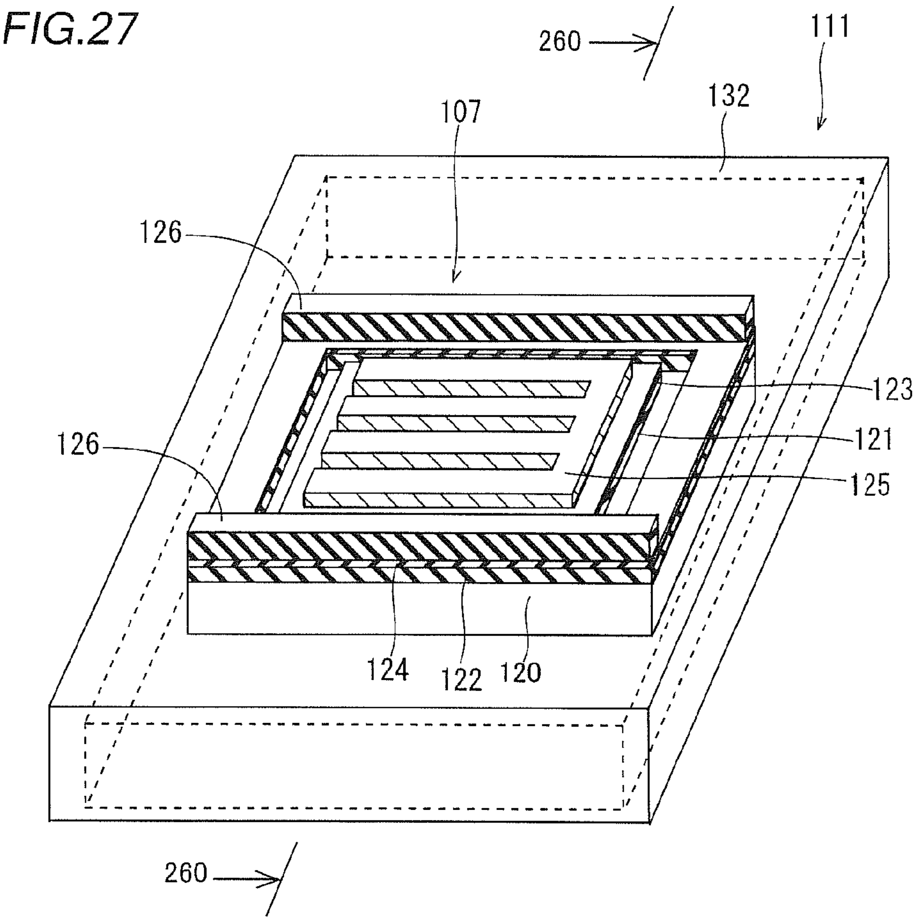
FIG. 27 is a schematic diagram of an electrostatic induction generator according to an eighth embodiment of the present invention.
Figure 28:
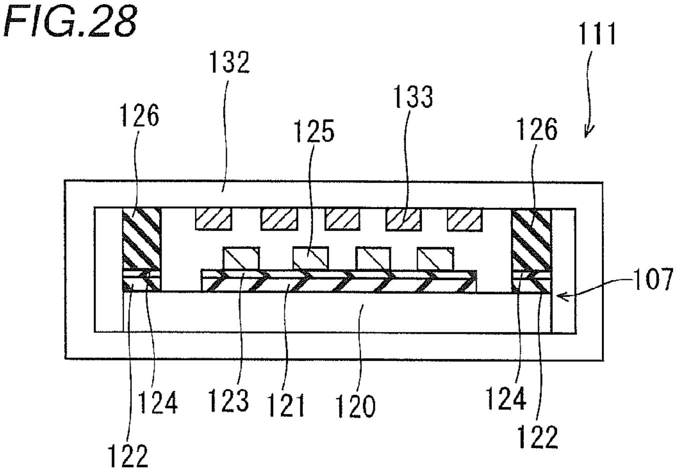
FIG. 28 is a sectional view taken along the line 260-260 in FIG. 27.

Referring to FIGS. 27 and 28, an electrostatic induction generator 111 according to an eighth embodiment has a structure in which a movable substrate 132 is so formed as to surround an entire electret device 107 formed with spacers 126 dissimilarly to the aforementioned seventh embodiment.

In the electrostatic induction generator 111 according to the eighth embodiment, the movable substrate 132 made of package resin such as epoxy resin having a thickness of about 1 mm to about 5 is so formed as to surround the entire electret device 107, as shown in FIGS. 27 and 28. Movable electrodes 133 are formed on a surface of the movable substrate 132. According to the eighth embodiment, the spacers 126 for inhibiting the metal film 125 and the movable electrodes 133 from coming into contact with each other, made of a dielectric material such as a silicon oxide film having a thickness of about 1 μm to about 50 μm are formed on an upper surface of a MSQ film 124. The remaining structure of the electret device according to the eighth embodiment is similar to that of the electret device according to the aforementioned seventh embodiment. The operation of the eighth embodiment is similar to that of the aforementioned seventh embodiment.

According to the eighth embodiment, as hereinabove described, the movable substrate 132 is so formed as to surround the entire electret device 107, whereby outside air of the electrostatic induction generator 111 and the electret film 121 are blocked and hence penetration of dusts or moisture can be inhibited from penetrating around the electret film 121. Thus, charges can be inhibited from flowing out from the electret film 121.

According to the eighth embodiment, as hereinabove described, the spacers 126 are formed on the upper surface of the MSQ film 124, whereby the metal film 125 and the movable electrodes 133 can be inhibited from coming into contact with each other and hence the metal film 125 and the movable electrodes 133 can be inhibited from breakage.

The remaining effects of the eighth embodiment are similar to those of the aforementioned seventh embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the electret film made of $SiO_2$ is employed in each of the aforementioned first to eighth embodiments, the present invention is not restricted to this but an electret film made of a silicon nitride film, or polytetrafluoroethylene (PTFE), tetrafluoroethylene-perfluoro alkylvinyl ether (PFA) or the like as represented by Teflon (registered trademark), having a volume resistivity of at least $1\times10^{15}$ Ω cm may be employed.

While the MSQ film made of MSQ is employed on the upper surface of the electret film in each of the aforementioned first to eighth embodiments, the present invention is not restricted to this but a film made of an organic material other than MSQ such as SiOC, for example, capable of inhibiting charges from flowing out may be employed.

While the charge outflow inhibition film 36, 46, 54 and 63 made of MSQ are employed in the aforementioned third to sixth embodiments, the present invention is not restricted to this but a charge outflow inhibition film made of an organic material other than MSQ such as SiOC, for example, capable of inhibiting charges from flowing out may be employed.

While the charge outflow inhibition film 36 is formed between the protective film 23 and the substrate 1 in the aforementioned third embodiment, the present invention is not restricted to this but a charge outflow inhibition film may be also formed between the electret film 2 and the protective film 23 similarly to the aforementioned fourth embodiment.

While the electrostatic induction generator as an exemplary electrostatic induction conversion device is shown in each of the aforementioned seventh and eighth embodiments, the present invention is not restricted to this but the present invention is also applicable for other electrostatic operating apparatus such as an actuator of an electrostatic induction type so far as the electrostatic operating apparatus includes an electret device.

While the comb-like metal film 125 is formed on the upper surface of the electret film 121 in each of the aforementioned seventh and eighth embodiments, the present invention is not restricted to this but an electret film may be formed in a comb-shape.

While the electret film is formed on the fixed electrode in each of the aforementioned seventh and eighth embodiments, the present invention is not restricted to this but an electret film may be formed on a movable electrode.

While the electrostatic induction generator generates power by moving the movable electrodes in each of the aforementioned seventh and eighth embodiments, the present invention is not restricted to this but a fixed electrode may be moved so that power is generated.

The electrostatic induction generator shown in each of the aforementioned seventh and eighth embodiments may be applicable for a wrist watch, a thermometer, a temperature indicator, a passometer, a remote control, a portable audio player, a keyless entry, a hearing aid, a pacemaker, a laser pointer, an electric toothbrush, a sensor, an e-book, a cellphone, a digital camera, a game console, a refrigerator, a washing machine, a dish dryer and a tire pressure sensor, for example.

What is claimed is:

1. An electret device comprising:

an electret film capable of storing charges; and a protective film formed so as to substantially surround a side end surface of said electret film, wherein said protective film is formed so as to surround said side end surface of said electret film at a prescribed interval.

2. The electret device according to claim 1, wherein the thickness of said protective film is substantially equal to that of said electret film.

3. The electret device according to claim 1, wherein said protective film includes a film made of an electret material, formed so as to surround said side end surface of said electret film at a prescribed interval.

4. The electret device according to claim 3, wherein said protective film is formed on a substrate at a prescribed interval from an end of said substrate.

5. The electret device according to claim 4, wherein a first charge outflow inhibition film made of an organic material capable of inhibiting charges stored in said protective film from flowing out is formed between said protective film and said end of said substrate.

6. The electret device according to claim 5, wherein said first charge outflow inhibition film is formed so as to cover said side end surface of said protective film.

7. The electret device according to claim 5, wherein the thickness of said first charge outflow inhibition film is at least the thickness of said protective film.

8. The electret device according to claim 3, wherein a second charge outflow inhibition film made of an organic material capable of inhibiting charges stored in said electret film from flowing out is formed between said electret film and said protective film.

9. The electret device according to claim 8, wherein said second charge outflow inhibition film is formed so as to cover said side end surface of said electret film opposed to said protective film and a side end surface of said protective film opposed to said electret film.

10. The electret device according to claim 8, wherein the thickness of said second charge outflow inhibition film is at least the thickness of said electrets film and the thickness of said protective film.

11. The electret device according to claim 1, wherein said protective film is made of an electret material, and charges having the same polarity are stored in said electret film and said protective film.

12. The electret device according to claim 1, wherein said electret film and said protective film are formed from the same layer.

13. The electret device according to claim 1, wherein said protective film is formed so as to cover said side end surface of said electret film.

14. The electret device according to claim 1, wherein said protective film is formed so as to cover a surface of said electret film.

15. The electret device according to claim 1, wherein a third charge outflow inhibition film made of an organic material capable of inhibiting charges stored in said electret film and said protective film from flowing out is formed on surfaces of said electret film and said protective film.

16. An electrostatic operating apparatus comprising:

a fixed electrode;

a movable electrode capable of moving with respect to said fixed electrode, provided so as to be opposed to said fixed electrode at a prescribed distance; and an electret device including an electret film capable of storing charges, formed on an upper surface of either said fixed electrode or said movable electrode and a protective film formed so as to surround said side end surface of said electret film at a prescribed interval.

17. The electrostatic operating apparatus according to claim 16, wherein the thickness of said protective film is substantially equal to that of said electret film.

18. The electrostatic operating apparatus according to claim 16, wherein a fourth charge outflow inhibition film made of an organic material capable of inhibiting charges stored in said electret film and said protective film from flowing out is formed on surfaces of said electret film and said protective film.

19. The electrostatic operating apparatus according to claim 16, further comprising a movable substrate having a surface formed with said movable electrode thereon and arranged so as to be opposed to said electrets film, wherein a spacer is provided on a surface of said fourth charge outflow inhibition film formed on a surface of said protective film.

20. The electrostatic operating apparatus according to claim 16, wherein said protective film is made of an electret material, and charges having the same polarity are stored in said electret film and said protective film.

* * * * *